United States Patent
Ikeda et al.

(10) Patent No.: US 9,548,187 B2
(45) Date of Patent: Jan. 17, 2017

(54) MICROWAVE RADIATION ANTENNA, MICROWAVE PLASMA SOURCE AND PLASMA PROCESSING APPARATUS

(71) Applicant: Tokyo Electron Limited, Tokyo (JP)

(72) Inventors: Taro Ikeda, Nirasaki (JP); Tomohito Komatsu, Nirasaki (JP); Shigeru Kasai, Nirasaki (JP); Hiroyuki Miyashita, Nirasaki (JP); Yuki Osada, Nirasaki (JP); Akira Tanihara, Nirasaki (JP); Yutaka Fujino, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 475 days.

(21) Appl. No.: 14/095,563

(22) Filed: Dec. 3, 2013

(65) Prior Publication Data
US 2014/0158302 A1    Jun. 12, 2014

(30) Foreign Application Priority Data
Dec. 10, 2012 (JP) ................................ 2012-269227

(51) Int. Cl.
*H01J 37/32* (2006.01)

(52) U.S. Cl.
CPC ...... *H01J 37/3222* (2013.01); *H01J 37/32201* (2013.01)

(58) Field of Classification Search
CPC .............. H05H 1/46; H05H 2001/4607; H05H 2001/4615; H05H 2001/4622; H05H 2001/463
USPC .................... 156/34.41; 118/723 MW, 723 R
See application file for complete search history.

(56) References Cited

U.S. PATENT DOCUMENTS

| 4,333,814 | A | 6/1982 | Kuyek |
| 4,776,918 | A | 10/1988 | Otsubo et al. |
| 5,545,258 | A | 8/1996 | Katayama et al. |
| 5,698,036 | A | 12/1997 | Ishii et al. |
| 6,245,192 | B1 | 6/2001 | Dhindsa et al. |

(Continued)

FOREIGN PATENT DOCUMENTS

| CN | 101047118 A | 10/2007 |
| CN | 101371341 A | 2/2009 |

(Continued)

*Primary Examiner* — Rakesh Dhingra
(74) *Attorney, Agent, or Firm* — Nath, Goldberg & Meyer; Jerald L. Meyer (57) ABSTRACT

A microwave radiation antenna includes an antenna body having a microwave radiation surface; a processing gas inlet configured to introduce a processing gas into the antenna body; a gas diffusion space configured to diffuse the processing gas in the antenna body; a plurality of gas outlets provided in the antenna body and configured to discharge the processing gas into the chamber; a plurality of slots provided in the antenna body under a state where the slots are separated from the gas diffusion space and the gas outlets; and an annular dielectric member provided in the microwave radiation surface side of the antenna body to cover a slot formation region where the slots are formed. A metal surface wave is formed in the microwave radiation surface by the microwave radiated through the slots and the annular dielectric member and a surface wave plasma is generated by the metal surface wave.

7 Claims, 9 Drawing Sheets

(56) References Cited

U.S. PATENT DOCUMENTS

| | | | |
|---|---|---|---|
| 6,286,454 B1 * | 9/2001 | Hirayama | C23C 16/45565 118/723 E |
| 2005/0276928 A1 * | 12/2005 | Okumura | H01J 37/32009 427/446 |
| 2007/0221623 A1 | 9/2007 | Horiguchi et al. | |
| 2007/0235425 A1 | 10/2007 | Oka et al. | |
| 2009/0045749 A1 * | 2/2009 | Ganachev | H01J 37/32192 315/111.21 |
| 2009/0074632 A1 * | 3/2009 | Ishibashi | H01J 37/32238 422/186.04 |
| 2011/0174778 A1 | 7/2011 | Sawada et al. | |
| 2011/0271908 A1 * | 11/2011 | Chang | H01J 37/32229 118/723 MW |
| 2012/0247675 A1 * | 10/2012 | Ikeda | C23C 16/45565 156/345.34 |
| 2013/0292047 A1 | 11/2013 | Tian et al. | |

FOREIGN PATENT DOCUMENTS

| | | |
|---|---|---|
| JP | 2000-294550 A | 10/2000 |
| JP | 2002-299330 A | 10/2002 |
| JP | 2002-371367 A | 12/2002 |
| JP | 2003-188103 A | 7/2003 |
| JP | 2003-234327 A | 8/2003 |
| JP | 2005-196994 A | 7/2005 |
| JP | 2008-251674 A | 10/2008 |
| JP | 3169134 U | 7/2011 |
| JP | 2012-216745 A | 11/2012 |
| WO | 2008013112 A1 | 1/2008 |
| WO | 2010/004997 A1 | 1/2010 |

* cited by examiner

MICROWAVE RADIATION ANTENNA, MICROWAVE PLASMA SOURCE AND PLASMA PROCESSING APPARATUS

CROSS-REFERENCE TO RELATED APPLICATION

This application claims the benefit of Japanese Patent Application No. 2012-269227, filed on Dec. 10, 2012, in the Japan Patent Office, the disclosure of which is incorporated herein in its entirety by reference.

TECHNICAL FIELD

The present disclosure relates to a microwave radiation antenna, a microwave plasma source and a plasma processing apparatus.

BACKGROUND

Plasma processing is a technique essential for manufacturing semiconductor devices. In recent years, due to an increasing demand for high-integration and high-speed of the LSIs (Large-Scale Integration circuits), there have been efforts to miniaturize semiconductor devices constituting LSIs. Accordingly, there is a need for a plasma processing apparatus to cope with such miniaturization of semiconductor devices with LSIs.

However, in a conventional parallel plate type or inductively coupled plasma processing apparatus, semiconductor devices are damaged by plasma due to high electron temperature of generated plasma. Further, since a region having high plasma density is limited, it is difficult to perform uniform and high-speed plasma processing for semiconductor wafers with LSIs.

In this regard, an RLSA (Radial Line Slot Antenna) microwave plasma processing apparatus is proposed to uniformly generate a high-density surface wave plasma having a low electron temperature.

The RLSA microwave plasma processing apparatus generates a surface wave plasma by using a microwave and processes target objects by using the surface wave plasma. In the RLSA microwave plasma processing apparatus, a radial line slot antenna, i.e., a planar slot antenna having a plurality of slots formed therein with a predetermined pattern, is provided in the upper portion of a chamber as a microwave radiation antenna, and a microwave guided from a microwave source is radiated into the chamber kept at vacuum through the slots. Further, a dielectric microwave transmission plate provided below the slots. By an electric field of the microwave, a surface wave plasma is generated in the chamber and target objects such as semiconductor wafers are processed by the plasma.

However, in the RLSA microwave plasma processing apparatus in which the microwave is introduced from a ceiling wall of the chamber, it may be difficult to control a gas flow if a processing gas is supplied from a gas inlet provided in a side wall of the chamber, which may result in insufficient plasma uniformity.

In order to avoid this problem, there has been proposed a technique in which a dielectric member having a plurality of gas holes is placed under the radial line slot antenna as a shower plate and a processing gas is introduced into a chamber via this shower plate. This technique may allow the processing gas to be uniformly supplied to a space immediately below the shower plate, thereby providing uniformly formed plasma.

However, the aforementioned technique may cause a problem of converting the processing gas within a gas space of the shower plate into a plasma, which may result in a loss of microwave power and an occurrence of abnormal discharging.

In order to solve this problem, there has been proposed a configuration in which a cover plate made of dielectric material having a relative dielectric constant lower than that of the shower plate is interposed between a microwave antenna and the dielectric shower plate. This configuration reduces a variation in relative dielectric constant of the shower plate including the gas space, which may result in prevention of power loss and abnormal discharging in the gas space of the shower plate.

However, since the shower plate is still a dielectric, the aforementioned configuration cannot fully prevent gas in the gas holes formed in the shower plate from converting into a plasma by the microwave transmitting the shower plate, which may still result in power loss and abnormal discharging. However, a technique for forming a uniform plasma while avoiding this problem has not yet been realized.

SUMMARY

Some embodiments of the present disclosure provide a microwave radiation antenna, a microwave plasma source and a plasma processing apparatus which are capable of forming a uniform plasma while preventing microwave power loss and abnormal discharging.

In accordance with a first aspect of the present disclosure, there is provided a microwave radiation antenna that radiates a microwave generated in a microwave generation mechanism and transmitted through a microwave transmission line into a chamber in a plasma processing apparatus, the plasma processing apparatus forming a surface wave plasma in the chamber to perform plasma processing. The antenna includes: an antenna body having a microwave radiation surface and made of conductive material; a processing gas inlet configured to introduce a processing gas into the antenna body; a gas diffusion space configured to diffuse the processing gas in the antenna body; a plurality of gas outlets provided in the antenna body and configured to discharge the processing gas diffused in the gas diffusion space into the chamber; a plurality of slots provided, corresponding to the microwave transmission line, in the antenna body under a state where the slots are separated from the gas diffusion space and the gas outlets, each of the slots being configured to radiate the microwave from an end portion disposed at the microwave radiation surface side; and an annular dielectric member provided in the microwave radiation surface side of the antenna body to cover a slot formation region where the slots are formed. In the microwave radiation antenna, a metal surface wave is formed in the microwave radiation surface by the microwave radiated through the slots and the annular dielectric member and a surface wave plasma is generated by the metal surface wave.

In accordance with a second aspect of the present disclosure, there is provided a microwave plasma source that generates a surface wave plasma by radiating a microwave into a chamber of a plasma processing apparatus. The microwave plasma source includes: a microwave output unit configured to generate and output the microwave; and a microwave supply unit configured to transmit the microwave output from the microwave output unit and radiate the microwave into the chamber. The microwave supply unit includes the microwave radiation antenna of the first aspect.

In accordance with a third aspect of the present disclosure, there is provided a plasma processing apparatus. The plasma processing apparatus includes: a chamber configured to accommodate a substrate to be processed; a gas supplying mechanism configured to supply a processing gas; and the microwave plasma source of the second aspect. In the plasma processing apparatus, a metal surface wave is formed on a surface of the microwave radiation antenna by the microwave supplied from the microwave radiation antenna of the microwave plasma source into the chamber, a surface wave plasma of a gas supplied from the gas supplying mechanism is generated by the metal surface wave, and the substrate in the chamber is processed by the plasma.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

An embodiment of the present disclosure will now be described in detail with reference to the drawings.
<Configuration of Plasma Processing Apparatus>

Figure 1:
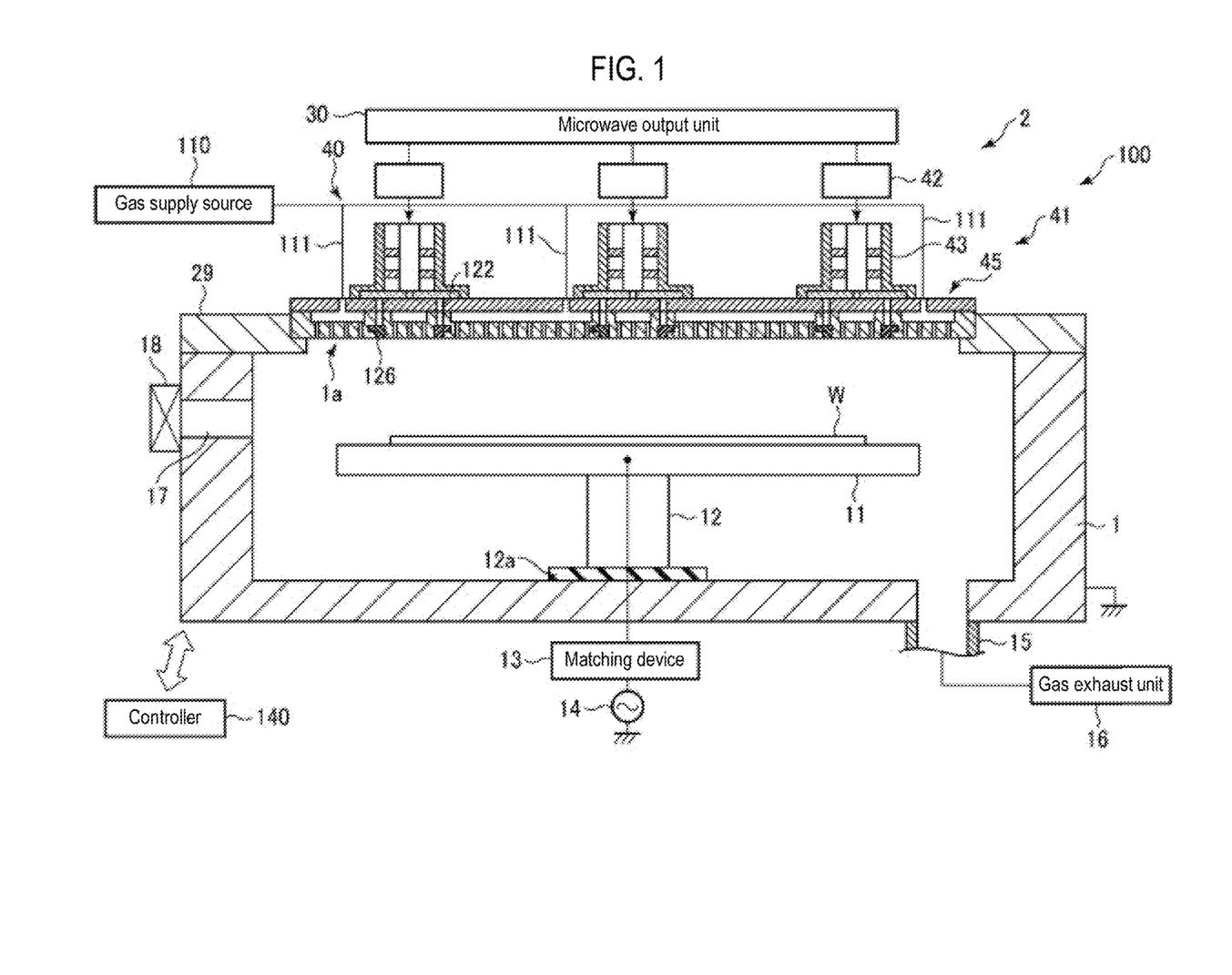
FIG. 1 is a sectional view showing a general configuration of a plasma processing apparatus according to one embodiment of the present disclosure.
Figure 2:
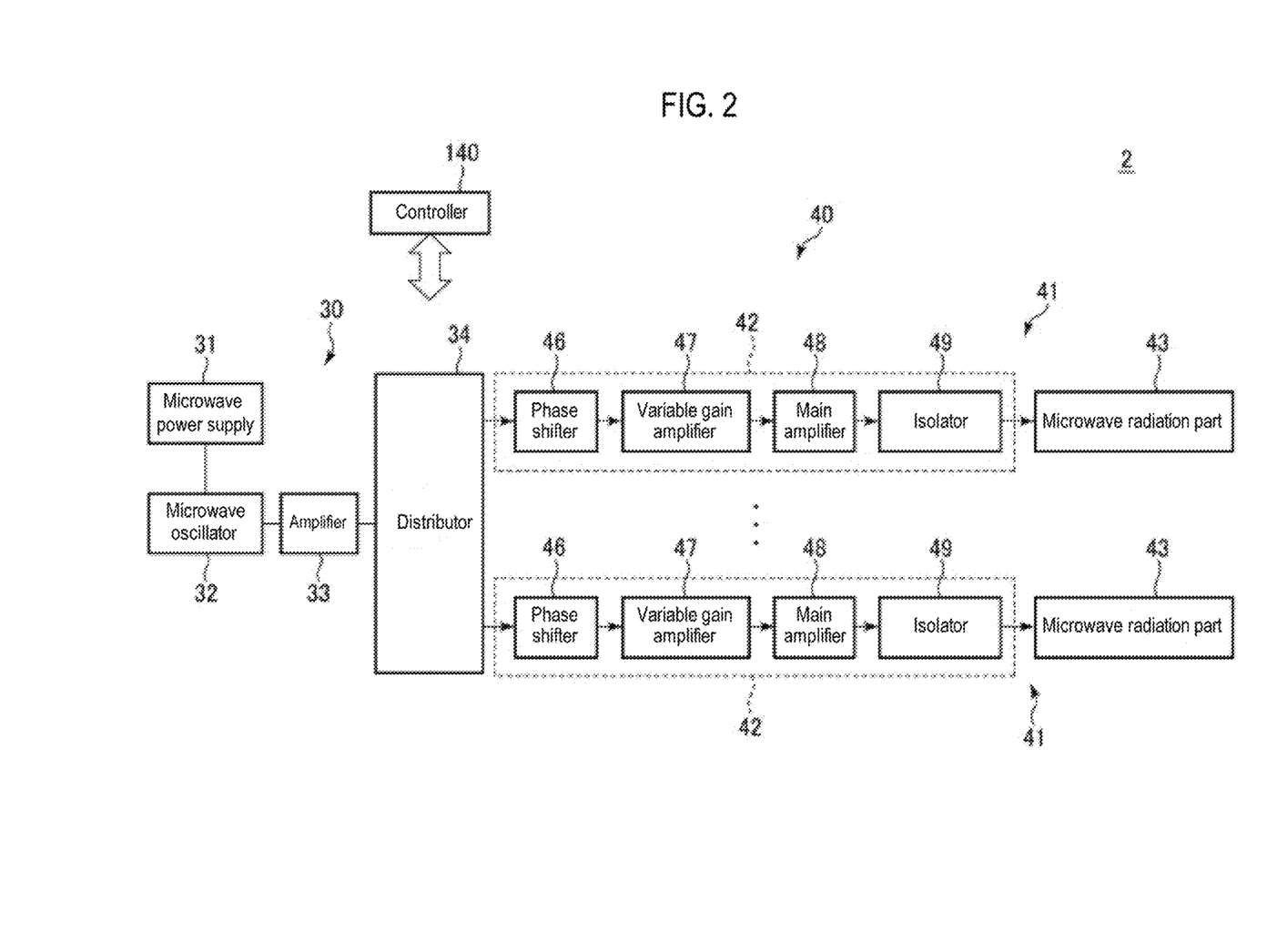
FIG. 2 is a block diagram showing a configuration of a microwave plasma source used in the plasma processing apparatus of FIG. 1 except a microwave radiation antenna.
Figure 3:
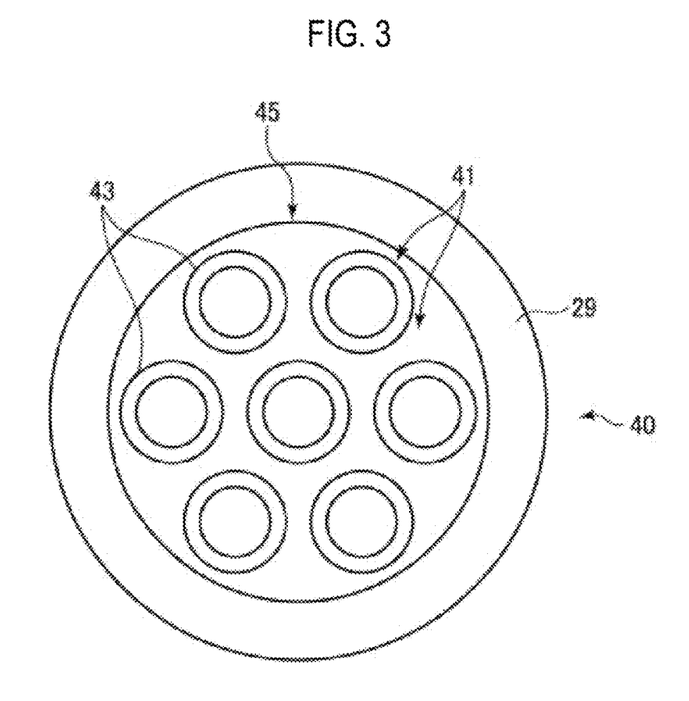
FIG. 3 is a plane view schematically showing a microwave supply unit in the microwave plasma source.

FIG. 1 is a sectional view showing a general configuration of a plasma processing apparatus according to one embodiment of the present disclosure, FIG. 2 is a block diagram showing a configuration of a microwave plasma source used in the plasma processing apparatus of FIG. 1 except a microwave radiation antenna, and FIG. 3 is a plane view schematically showing a microwave supply unit in the microwave plasma source.

Referring to FIG. 1, in this example, a plasma processing apparatus 100 may be implemented with a plasma etching apparatus for performing an etching process as a plasma processing for a wafer. The plasma processing apparatus 100 includes a cylindrical grounded chamber 1 which is configured in an airtight manner and is made of metal such as aluminum, stainless steel or the like, and a microwave plasma source 2 for generating a microwave plasma in the chamber 1. The chamber 1 has an opening 1a in the upper portion and the microwave plasma source 2 is arranged to face the interior of the chamber 1 through the opening 1a.

In the chamber 1, a susceptor 11 for horizontally supporting a semiconductor wafer W (hereinafter, simply referred as a wafer W) as an object to be processed is provided. The susceptor 11 is supported by a cylindrical supporting member 12 erected in the bottom center of the chamber 1 via an insulating member 12a. The susceptor 11 and the supporting member 12 are made of, for example, aluminum having an alumite-treated (anodized) surface, ceramics such as AlN, or the like.

In addition, although not shown, the susceptor 11 is provided with an electrostatic chuck for adsorbing the wafer W electrostatically, a temperature control mechanism, a gas passage for supplying a heat transfer gas to the back side of the wafer W and elevating pins moving vertically to transfer the wafer W. In addition, the susceptor 11 is electrically connected with a high-frequency bias power supply 14 via a matching device 13. When high-frequency power is supplied from the high-frequency bias power supply 14 to the susceptor 11, ions in plasma are attracted to the wafer W side. Alternatively, the high-frequency bias power supply 14 may not be provided depending on characteristics of the plasma processing.

A gas exhaust pipe 15 is connected to the bottom of the chamber 1 and a gas exhaust unit 16 including a vacuum pump is connected to the gas exhaust pipe 15. When the gas exhaust unit 16 is activated, the interior of the chamber 1 is evacuated and depressurized to a predetermined vacuum level at high speed. In addition, on a side wall of the chamber 1 are provided a gate 17 for loading and unloading the wafer W and a gate valve 18 for opening and closing the gate 17.

The microwave plasma source 2 includes a microwave output unit 30 for outputting a microwave to a plurality of branch paths, and a microwave supply unit 40 for radiating the microwave output from the microwave output unit 30 into the chamber 1. The microwave supply unit 40 has a microwave radiation antenna 45 via which a microwave is radiated and a gas is introduced into the chamber 1. The microwave radiation antenna 45 is provided in such a manner that the microwave radiation antenna 45 is airtightly sealed to a support ring 29 provided in an upper portion of the chamber 1. The microwave radiation antenna 45 is configured as a ceiling wall of the chamber 1. The microwave plasma source 2 further includes a gas supply source 110 that supplies a plasma generation gas for generating a plasma and a processing gas for performing a film forming or an etching process.

A rare gas such as an Ar gas or the like may be appropriately used as the plasma generation gas. As the processing gas, various gases may be used depending on types of processing, for example, a film forming process, an etching process and so on.

As shown in FIG. 2, the microwave output unit 30 includes a microwave power supply 31, a microwave oscillator 32, an amplifier 33 for amplifying an oscillated microwave, and a distributer 34 for distributing the amplified microwave.

The microwave oscillator 32 performs, for example, a PLL (Phase-Locked Loop) oscillation on a microwave having a predetermined frequency (e.g., 915 MHz). The distributer 34 distributes the microwave amplified in the amplifier 33 while making impedance matching between input and output sides so as to minimize the loss of the microwave. The microwave frequency may range from 700 MHz to 3 GHz.

The microwave supply unit 40 includes a plurality of antenna modules 41 for guiding the microwave distributed in the distributer 34 into the chamber 1, in addition to the microwave radiation antenna 45 (not shown in FIG. 2). Each antenna module 41 includes an amplifier part 42 for amplifying the distributed microwave, and a microwave radiation part 43. As shown in FIG. 3, in some embodiments, the microwave supply unit 40 includes seven antenna modules 41 and the microwave radiation parts 43 of each antenna module 41 are arranged on the circular microwave radiation antenna 45 such that one antenna module 41 is disposed on the center portion of the microwave radiation antenna 45 and six antenna modules 41 are disposed along the circumference of the microwave radiation antenna 45.

The microwave radiation antenna 45 is connected with the above-mentioned plurality of microwave radiation parts 43 and has a shower structure for discharging the plasma generation gas and the processing gas, as will be described later. A gas pipe 111 extending from the gas supply source 110 is connected to the microwave radiation antenna 45. The plasma generation gas introduced form the microwave radiation antenna 45 into the chamber 1 is converted into a plasma by the microwave radiated from the microwave radiation antenna 45, and the processing gas introduced from the microwave radiation antenna 45 into the chamber 1 is excited by this plasma to generate a plasma of the processing gas.

The amplifier part 42 includes a phase shifter 46, a variable gain amplifier 47, a main amplifier 48 forming a solid state amplifier, and an isolator 49.

The phase shifter 46 is configured to shift a phase of the microwave, and radiation characteristics of the microwave can be modulated by adjusting the phase shifter 46. For example, a plasma distribution can be changed by controlling the directionality of the antenna modules 41 by adjusting the phase of each antenna module 41. In addition, a circularly-polarized wave can be obtained by shifting phases of adjacent antenna modules 41 by 90 degrees. In addition, the phase shifter 46 can be used for spatial synthesis in a tuner by adjusting delay characteristics between components in the amplifier part 42. However, the phase shifter 46 is not necessary if the adjustment of the delay characteristics between the components in the amplifier part 42 and the modulation of the radiation characteristics of the microwave are not required.

The variable gain amplifier 47 is used to adjust plasma intensity by adjusting a power level of the microwave input to the main amplifier 48. It is also possible to adjust a plasma distribution by adjusting the variable gain amplifier 47 for each antenna module 41.

The main amplifier 48 forming a solid state amplifier may be configured to include, for example, an input matching circuit, a semiconductor amplifying element, an output matching circuit and a high-Q resonance circuit.

The isolator 49 is used to separate a microwave reflected from the microwave radiation antenna 45 toward the main amplifier 48 and includes a circulator and a dummy load (coaxial termination). The circulator guides the microwave reflected by the microwave radiation antenna 45 to the dummy load, and the dummy load converts the microwave guided by the circulator into heat.

Figure 4:
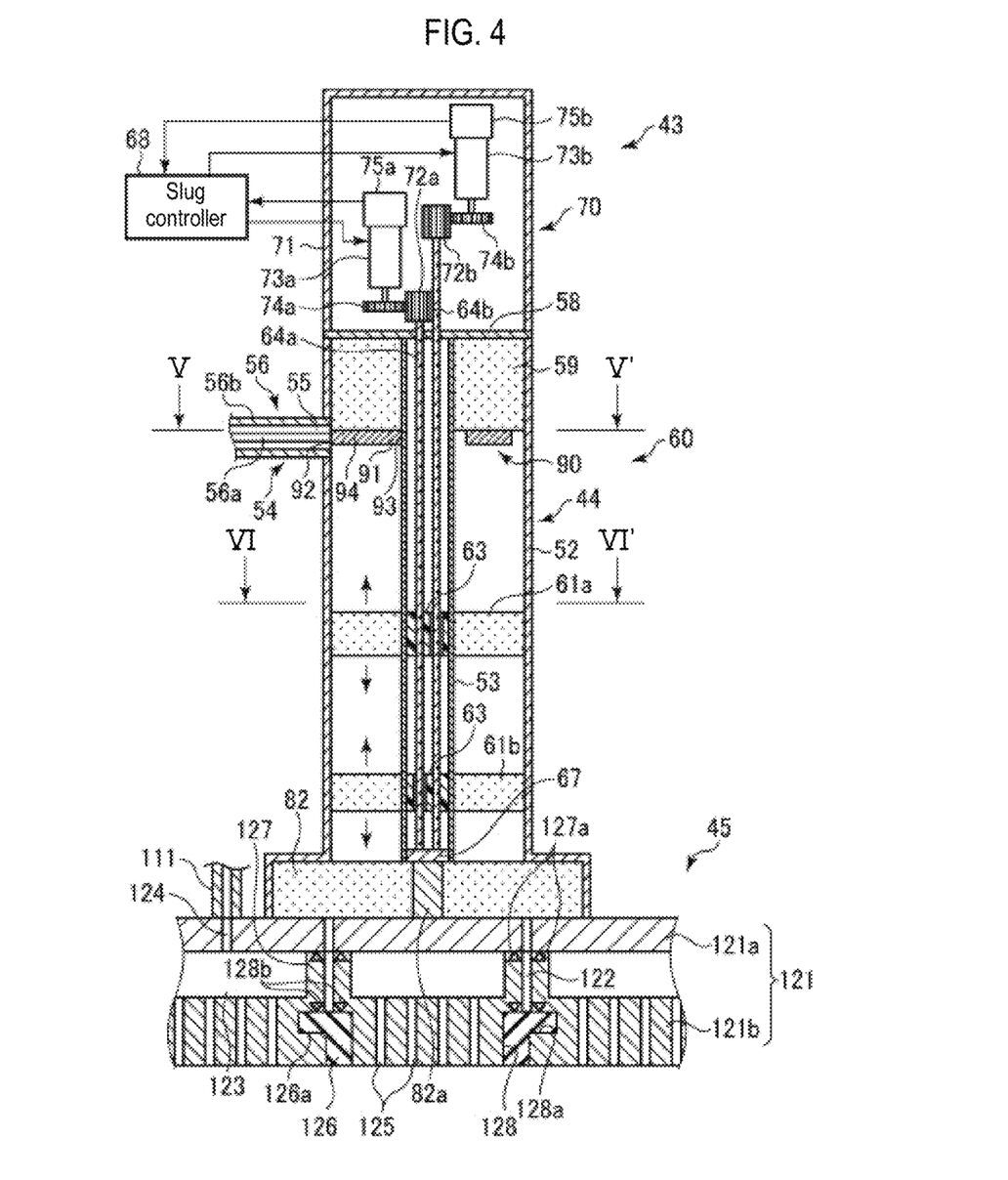
FIG. 4 is a longitudinal sectional view showing a microwave radiation part and a microwave radiation antenna in the plasma processing apparatus of FIG. 1.
Figure 5:
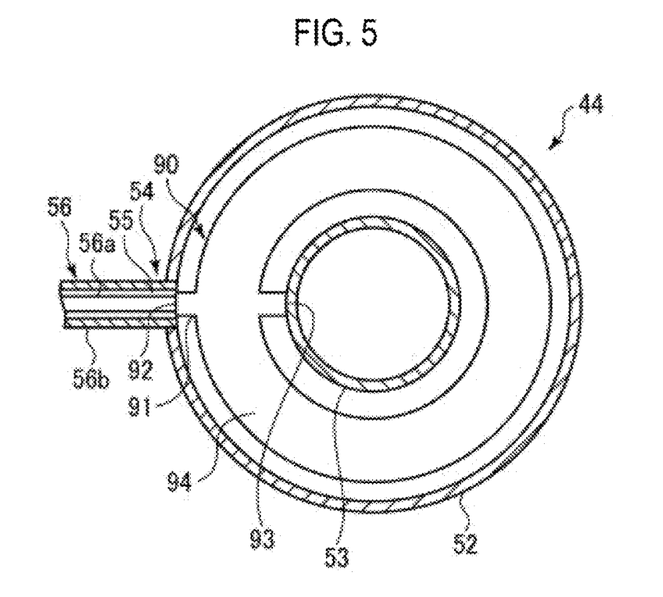
FIG. 5 is a cross sectional view taken along line V-V' in FIG. 4, showing a power feeding mechanism of the microwave radiation part.
Figure 6:
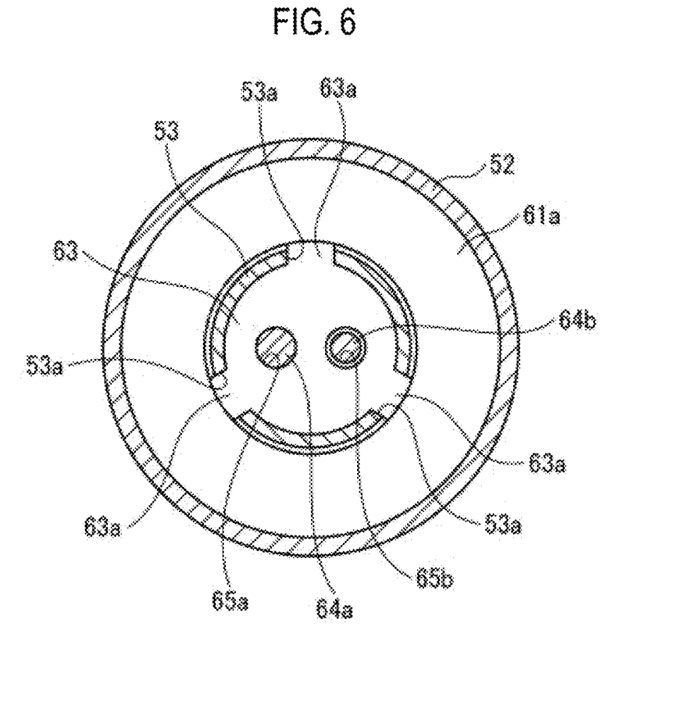
FIG. 6 is a cross sectional view taken along line VI-VI' in FIG. 4, showing a slug and a sliding member in a tuner.
Figure 7:
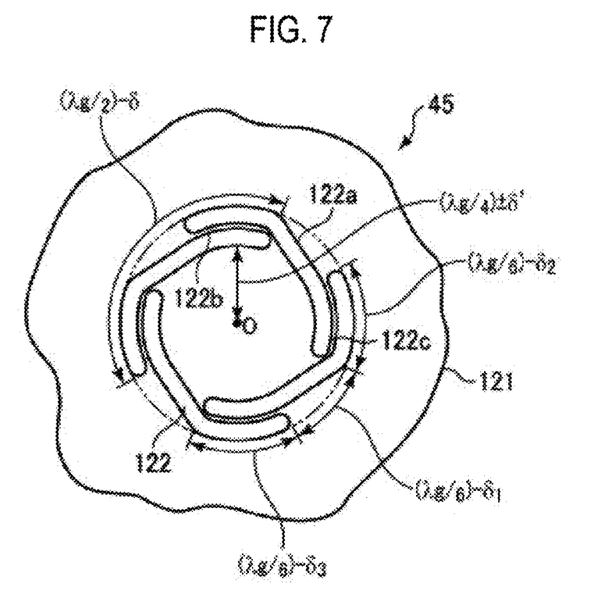
FIG. 7 is a plane view showing one example of shape and arrangement of slots in the microwave radiation antenna.
Figure 8:
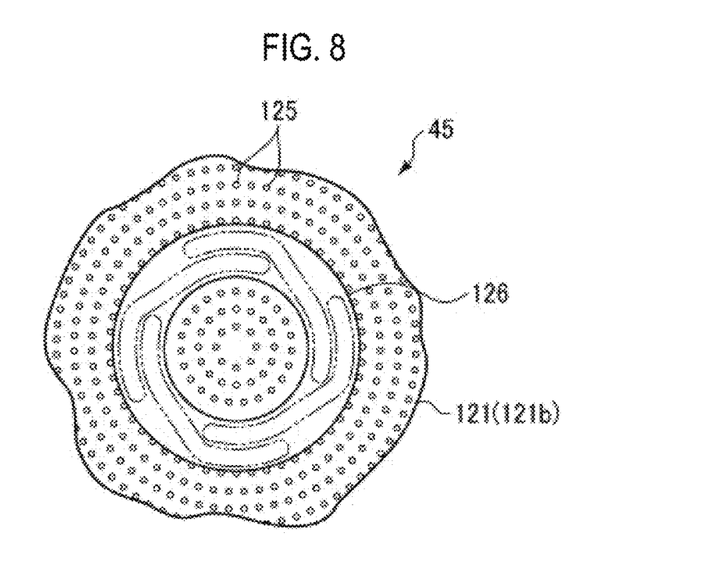
FIG. 8 is a bottom view showing a microwave radiation surface of the microwave radiation antenna.

Subsequently, the microwave radiation part 43 and the microwave radiation antenna 45 will be described in detail with reference to FIGS. 4 to 8. FIG. 4 is a sectional view showing the microwave radiation part 43 and the microwave radiation antenna 45. FIG. 5 is a cross sectional view taken along line V-V' in FIG. 4, showing a power feeding mechanism of the microwave radiation part 43. FIG. 6 is a cross sectional view taken along line VI-VI' in FIG. 4, showing a slug and a sliding member in a tuner 60 of the microwave radiation part 43. FIG. 7 is a plane view showing one example of shape and arrangement of slots in the microwave radiation antenna 45. FIG. 8 is a bottom view showing a microwave radiation surface of the microwave radiation antenna 45.

As shown in FIG. 4, the microwave radiation part 43 includes a coaxial-structured microwave transmission line (waveguide) 44 for transmitting a microwave, and a tuner 60 provided in the microwave transmission line 44. The microwave transmitted via the microwave transmission line 44 of the microwave radiation part 43 is radiated into the chamber 1 from a slot, which will be described later, provided corresponding to each microwave radiation part 43 in the microwave radiation antenna 45, and then a surface wave plasma is generated in the chamber 1 by the microwave.

The microwave transmission line 44 includes a cylindrical outer conductor 52 and a bar-shaped inner conductor 53 coaxially disposed in the center of the outer conductor 52. The microwave radiation antenna 45 is placed at the leading end of the microwave transmission line 44. In the microwave transmission line 44, the inner conductor 53 is fed with electric power and the outer conductor 52 is grounded. A reflection plate 58 is provided in the upper end of the outer conductor 52 and the inner conductor 53.

A power feeding mechanism 54 for feeding the microwave (electromagnetic wave) is provided in the base end of the microwave transmission line 44. The power feeding mechanism 54 has a microwave power inlet port 55 for introducing microwave power into the microwave transmission line 44. The microwave power inlet port 55 is provided on the lateral side of the microwave transmission line 44 (the outer conductor 52). The microwave power inlet port 55 is connected with a coaxial line 56 including an inner conductor 56a and an outer conductor 56b. The coaxial line 56 acts as a power feeding line for feeding the microwave amplified by the amplifier part 42. The leading end of the inner conductor 56a of the coaxial line 56 is connected with a power feeding antenna 90 horizontally extending toward the interior of the outer conductor 52.

The power feeding antenna 90 is formed, for example, by machining a metal plate made of aluminum or the like and then fitting it into a dielectric frame made of Teflon® or the like. Between the reflection plate 58 and the power feeding antenna 90, a retardation member 59 made of a dielectric such as Teflon® or the like is provided to shorten the effective wavelength of a reflected wave. However, if a microwave having a high frequency such as 2.45 GHz or the like is used, the retardation member 59 may not be provided. At this time, the maximal electromagnetic wave can be transmitted into the coaxial-structured microwave transmission line 44 by optimizing a distance from the power feeding antenna 90 to the reflection plate 58 and reflecting the electromagnetic wave radiated from the power feeding antenna 90 by the reflection plate 58.

As shown in FIG. 5, the power feeding antenna 90 includes an antenna body 91, which is connected to the inner conductor 56a of the coaxial line 56 in the microwave power inlet port 55 and has a first electrode 92 fed therein with an electromagnetic wave and a second electrode 93 radiating therefrom the fed electromagnetic wave, and an annular reflector 94 extending from both sides of the antenna body 91 along the outer side of the inner conductor 53. With this configuration, the power feeding antenna 90 generates a standing wave by using an electromagnetic wave incident into the antenna body 91 and an electromagnetic wave reflected by the reflector 94. The second electrode 93 of the antenna body 91 is in contact with the inner conductor 53.

When the power feeding antenna 90 radiates the microwave (electromagnetic wave), microwave power is fed into a space between the outer conductor 52 and the inner conductor 53. Then, the microwave power fed by the power feeding mechanism 54 propagates toward the microwave radiation antenna 45.

The tuner 60 matches the impedance of a load (plasma) within the chamber 1 to the characteristic impedance of the microwave power in the microwave output unit 30. The tuner 60 includes two slugs 61a and 61b vertically moving along the microwave transmission line 44 between the outer conductor 52 and the inner conductor 53 and a slug deicing unit 70 provided in the outer side (upper side) of the reflection plate 58.

The slug 61a is provided in the side of slug driver 70 and the slug 61b is provided in the side of microwave radiation antenna 45. In addition, two slug movement shafts 64a and 64b are provided in the inner space of the inner conductor 53. Each of the slug movement shafts 64a and 64b includes a threaded rod on which, for example, a trapezoidal screw is formed along the longitudinal direction, so that the slugs 61a and 61b move vertically along the slug movement shafts 64a and 64b.

As shown in FIG. 6, the slug 61a has an annular shape and is made of a dielectric. A sliding member 63 made of slippery resin is fitted inside the slug 61a. The sliding member 63 is provided with a screw hole 65a in which the slug movement shaft 64a is screwed and a through hole 65b in which the slug movement shaft 64b is inserted. Like the slug 61a, the slug 61b has a screw hole 65a and a through hole 65b formed in a sliding member 63. However, contrary to the slug 61a, the screw hole 65a of the slug 61b is screwed with the slug movement shaft 64b and the slug movement shaft 64a is inserted in the through hole 65b of the slug 61b. With this configuration, the slug 61a to moves vertically when the slug movement shaft 64a is rotated and the slug 61b moves vertically when the slug movement shaft 64b is rotated. That is, the slugs 61a and 61b move vertically by a screw mechanism including the slug movement shafts 64a and 64b and the sliding members 63.

The inner conductor 53 has three slits 53a formed at equal intervals along the circumferential direction. On the other hand, the sliding member 63 has three projections 63a formed at equal intervals so as to correspond to the slits 53a. Under a state where the projections 63a are in contact with the inner circumference of the slugs 61a and 61b, the sliding members 63 are fitted in the slugs 61a and 61b. The outer circumferential surface of each sliding member 63 is in contact with the inner circumferential surface of the inner conductor 53 with no margin, and the sliding members 63 are adapted to be slid and move vertically along the inner conductor 53 when the slug movement shafts 64a and 64b are rotated. That is, the inner circumferential surface of the inner conductor 53 functions as a sliding guide of the slugs 61a and 61b.

As the resin material forming the sliding member 63, a resin having good slidability and formability, for example, a PPS (polyphenylene sulfide) resin, may be used.

The slug movement shafts 64a and 64b extend to the slug driving unit 70 through the reflection plate 58. Bearings (not shown) are interposed between the slug movement shafts 64a and 64b and the reflection plate 58. In addition, a bottom plate 67 made of conductive material is provided in a lower end portion of the inner conductor 53. The lower ends of the slug movement shafts 64a and 64b are open in order to absorb vibration generated during driving the slug movement shafts 64a and 64b and the bottom plate 67 is spaced apart from the lower end of the slug movement shafts 64a and 64b by 2 mm to 5 mm or so. Alternatively, the bottom plate 67 may be configured as a bearing portion and the lower end of the slug movement shafts 64a and 64b may be axially supported by the bearing portion.

The slug driving unit 70 has a housing 71. The slug movement shafts 64a and 64b extend into the housing 71, and gears 72a and 72b are mounted on the upper ends of the slug movement shafts 64a and 64b, respectively. In addition, the slug driving unit 70 is provided with a motor 73a for rotating the slug movement shaft 64a and a motor 73b for rotating the slug movement shaft 64b. A gear 74a is mounted on the shaft of the motor 73a and a gear 74b is mounted on the shaft of the motor 73b. The gears 74a and 74b are adapted to engage with the gears 72a and 72b, respectively. Accordingly, the slug movement shaft 64a is rotated by the motor 73a via the gears 74a and 72a, while the slug movement shaft 64b is rotated by the motor 73b via the gears 74b and 72b. An example of the motors 73a and 73b may include a stepping motor.

The slug movement shaft 64b is longer than the slug movement shaft 64a, and thus, may be able to reaches a position higher than the slug movement shaft 64a can. Therefore, the gears 72a and 72b are vertically offset from each other and the motors 73a and 73b are also vertically offset from each other. This configuration allows a driving power transmission mechanism including the gears 72a and 72b and the motors 73a and 73b to be accommodated in a small space. Accordingly, the housing 71 has the same diameter to that of the outer conductor 52.

On the motors 73a and 73b are respectively provided incremental encoders 75a and 75b which are directly connected to the output shafts of the motors 73a and 73b for detecting positions of the slugs 61a and 61b.

The positions of the slugs 61a and 61b are controlled by a slug controller 68. Specifically, based on an impedance value of an input terminal detected by an impedance detector (not shown) and position information of the slugs 61a and 61b detected by the encoders 75a and 75b, the slug controller 68 transmits control signals to the motors 73a and 73b and adjusts the impedance value by controlling the positions of the slugs 61a and 61b. The slug controller 68 executes an impedance matching such that a termination has, for example, 50Ω. When only one of the slugs 61a and 61b is moved, a trajectory passing through the origin of the Smith chart is drawn. When both of the slugs 61a and 61b are simultaneously moved, a phase is rotated only.

In the leading end of the microwave transmission line 44, a retardation member 82 is provided to be in contact with the microwave radiation antenna 45. A columnar member 82a made of conductive material passes through the center of the retardation member 82 to be connected to the bottom plate 67 and the microwave radiation antenna 45. Accordingly, the inner conductor 53 is connected to the microwave radiation antenna 45 via the bottom plate 67 and the columnar member 82a. In addition, the lower end of the outer conductor 52 extends up to the microwave radiation antenna 45 such that the circumferential portion of the retardation member 82 is covered with the outer conductor 52.

The retardation member 82 has a dielectric constant higher than the dielectric constant in vacuum and is made of, for example, quartz, ceramics, a fluorine-based resin such as polytetrafluoroethylene, a polyimide-base resin or the like. Since a wavelength of a microwave is lengthened in vacuum, the retardation member 82 functions to reduce a size of the microwave radiation antenna 45 by shortening the wavelength of the microwave. A phase of a microwave can be adjusted by the thickness of the retardation member 82. Accordingly, the thickness of the retardation member 82 is set such that a surface (microwave radiation surface) of the microwave radiation antenna 45 is positioned to "antinode" of a standing wave. With this configuration, reflection of the microwave can be minimized and microwave radiation energy can be maximized.

The microwave radiation antenna 45 may be implemented with a planar slot antenna formed in a plane shape and having slots. The microwave radiation antenna 45 includes a disc-like antenna body 121 having a bottom surface as a microwave radiation surface, a plurality of slots 122 formed in the antenna body 121 to radiate a microwave transmitted through the microwave transmission line 44 of each microwave radiation part 43 into the chamber 1, a gas diffusion space 123 formed inside the antenna body 121 to diffuse a processing gas, a gas inlet 124 for introducing a plasma generation gas or the processing gas into the gas diffusion space 123, a plurality of gas outlets 125 extending from the gas diffusion space 123 to face the chamber 1, and an annular dielectric member 126 provided in the microwave radiation surface side of the antenna body 121 to correspond to the slots 122 of the microwave radiation part 43.

The antenna body 121 is made of conductive material, typically, metal. In some embodiments, the conductive material forming the antenna body 121 is metal having high conductivity, such as aluminum, copper or the like. The antenna body 121 includes an upper wall 121*a* and a lower wall 121*b* forming a shower plate.

The gas inlet 124 is provided in the upper wall 121*a* and is connected with the gas pipe 111 extending from the gas supply source 110. The plasma generation gas such as Ar and the processing gas such as a fluorocarbon gas (e.g., $C_4F_8$) supplied from the gas supply source 110 are introduced into the gas diffusion space 123 via the gas inlet 124. The gas outlets 125 are formed in the lower wall 121*b* and are configured to discharge the gases introduced into the gas diffusion space 123 into the chamber 1.

The slots 122 are formed to pass through the upper wall 121*a* and the gas diffusion space 123 and then penetrate into the lower wall 121*b*. The slots 122 in the gas diffusion space 123 are formed inside projections 127 projecting from the lower wall 121*b*. This configuration allows the microwave passing through the slots 122 to be separated from the gases flowing through the gas diffusion space 123 and prevents plasma generation within the microwave radiation antenna 45. On the upper end portions of the projections 127, seal members 127*a* for gas-sealing between the projections 127 and the upper wall 121*a* are provided.

The slots 122 may be filled with dielectric material. When the slots 122 are filled with the dielectric material, the effective wavelength of the microwave can be shortened, thereby allowing the overall thickness of the slots 122 (i.e., the thickness of the antenna body 121) to be smaller. An example of the dielectric material with which the slots 122 are filled may include quartz, ceramics, a fluorine-based resin such as polytetrafluoroethylene, a polyimide-base resin or the like.

The shape of the slots 122 in the microwave radiation surface, which determines microwave radiation characteristics of each microwave radiation part 43, is, for example, as shown in FIG. 7. Specifically, four slots 122 are equally arranged to form a circumference as a whole. These slots 122 have the same shape elongated along the circumference. These slots 122 are symmetrically arranged with respect to a point O corresponding to the central axis of the microwave radiation part 43 in the microwave radiation plane of the antenna body 121.

The length of each slot 122 in the circumferential direction is $(\lambda G/2)-\delta$ and is designed such that the peak of microwave electric field intensity is placed on the central position of the slot 122. Where, $\lambda g$ is an effective wavelength of the microwave and $\delta$ is a fine tuning factor (including zero) used to increase uniformity of the electric field intensity in the circumferential (or angular) direction. $\lambda g$ may be expressed by:

$$\lambda g = \lambda/\epsilon s^{1/2},$$

where $\epsilon s$ is a dielectric constant of the dielectric material filling the slot 122 and $\lambda$ is a wavelength of the microwave in vacuum. The length of the slot 122 is not limited to about $\lambda g/2$ but may be a subtraction of a fine tuning factor (including zero) from an integer multiple of $\lambda g/2$.

A joint portion of two adjacent slots 122 is configured such that the inside of an end portion of one slot 122 and the outside of an end portion of another slot 122 overlap with each other with a predetermined gap in the radial direction therebetween. With this configuration, there is no portion in the circumference formed by the slots 122 where no slot exists in the circumferential direction, which results in uniform radiation characteristics of the microwave radiation part 43 in the circumferential direction. Each slot 122 is divided into three portions, i.e., a central portion 122*a*, a left end portion 122*b* and a right end portion 122*c*, in the circumferential direction. The left end portion 122*b* and the right end portion 122*c* are substantially fan-shaped (arc-shaped) and the central portion 122*a* is in a straight-line shape connecting the left end portion 122*b* and the right end portion 122*c*. Each slot 122 is arranged on the microwave radiation surface such that the left end portion 122*b* and the right end portion 122*c* are disposed at the outer side and at the inner side in the circumferential direction, respectively. In addition, the slots 122 are arranged on the microwave radiation surface such that the left end portion 122*b* of one slot 122 is disposed at the outer side in the circumferential direction with respect to the right end portion 122*c* of another slot 122 adjacent to the left end portion 122*b*, and the right end portion 122*c* of one slot 122 is disposed at the inner side in the circumferential direction with respect to the left end portion 122*b* of another slot 122 adjacent to the right end portion 122*c*. The central portion 122*a*, the left end portion 122*b* and the right end portion 122*c* have substantially the same length. That is, the central portion 122*a*, the left end portion 122*b* and the right end portion 122*c* have lengths of $(\lambda/6)-\delta 1$, $(\lambda g/6)-\delta 2$ and $(\lambda g/6)-\delta 3$, respectively. Where, $\delta 1$, $\delta 2$ and $\delta 3$ are fine tuning factors (including zero) used to increase uniformity of electric field intensity in the circumferential (or angular) direction. In some embodiments, since lengths of portions where adjacent slots 122 overlap with each other are preferably the same, $\delta 2$ is set to be equal to $\delta 3$.

The slots 122 are arranged such that the inner circumferences of the slots 122 are distanced from the point O of the antenna body 121 by:

$$(\lambda g/4) \pm \delta',$$

where, $\delta'$ is a fine tuning factor (including zero) used to provide a uniform distribution of electric field intensity in the radial direction. The distances from the point O to the inner circumferences of the slots 122 are not limited to about $\lambda g/4$ but may be a sum of the fine tuning factor (including zero) and an integer multiple of $\lambda g/4$.

In the microwave radiation antenna 45 having the above-described configuration, since the end portions 122b and 122c of slots 122 having low electric field intensity are arranged in an overlapping manner in each microwave radiation part 43, the electric field intensity at that portion can be increased, which results in a uniform distribution of electric field intensity in the circumferential (angular) direction.

The number of slots 122 of each microwave radiation part 43 is not limited to four but may be three or five or more to achieve the same effects. In addition, the shape of the slots 122 is not limited to that shown in FIG. 7. Instead, a plurality of arc-like slots evenly formed on the circumference.

Since gaps between the left end portions 122b and the right end portions 122c of the slots 122 in the overlap portions thereof are narrow, if the projections 127 are formed in the gas diffusion space 123 with that gap as they are, a gas conductance in the gas diffusion space 123 may be lowered to deteriorate uniformity of gas flow rate. In order to prevent the deterioration of the uniformity of a gas flow rate, the gaps between the left end portions 122b and the right end portions 122c of the slots 122 in the overlap portions may be widened in portions of the slots 122 corresponding to the projections 127 and the upper wall 121a. In that case, there occur steps between in the portions of the slots 122 corresponding to the projections 127 and the upper wall 121a and in portions of the slots 122 corresponding to the lower wall 121b.

On the microwave radiation surface side of the lower wall 121b of the antenna body 121, an annular concave portion 128 is formed in a portion corresponding to the slots 122 and an annular dielectric member 126 is inserted into the concave portion 128. The concave portion 128 is formed with a step 128a and the annular dielectric member 126 has a flange 126a corresponding to this step 128a. Thus, the annular dielectric member 126 is supported by the lower wall 121b. The annular dielectric member 126 is provided in the microwave radiation surface side of the antenna body 121 to include (cover) a slot formation region where the slots 122 of each microwave radiation part 43 is formed (see the bottom view of the antenna body 121 in FIG. 8). In addition, in a portion of the lower wall 121b in contact with the annular dielectric member 126 inserted into the concave portion 128, seal members 128b are provided in the inner side and the outer side with respect to the slots 122 in the circumferential direction. With this configuration, the annular dielectric member 126 seals the slots 122. The seal members 128b serve as a vacuum seal and partition a vacuum region below the seal members 128b and an atmospheric region above the seal members 128b.

An example of material of the annular dielectric member 126 may include quartz, ceramics, a fluorine-based resin such as polytetrafluoroethylene, a polyimide-base resin or the like.

Although the annular dielectric member 126 is formed in the circular ring shape in the embodiment of FIG. 8, it may have a polygonal ring shape such as a triangular ring shape, a rectangular ring shape or the like.

As shown in FIGS. 4 and 8, the gas outlets 125 formed in the antenna body 121 are provided in both of the outer region and the inner region of the annular dielectric member 126 in the microwave radiation surface.

A DC voltage may be applied to the microwave radiation antenna 45. By applying the DC voltage, it is possible to control a thickness of a sheath through which a metal surface wave formed on the surface of the microwave radiation antenna 45 when a microwave power is applied propagates. This configuration allows for optimization of electron density distribution, ion density distribution and radical density distribution of plasma.

In this embodiment, the main amplifier 48, the tuner 60 and the microwave radiation antenna 45 are arranged in proximity. In addition, the tuner 60 and the microwave radiation antenna 45 are arranged within a half wavelength distance to form a lumped constant circuit and the combined resistance of the microwave radiation antenna 45 and the retardation member 82 is set to $50\Omega$. Therefore, the tuner 60 directly tunes a plasma load, which can result in efficient transfer of energy to plasma.

Various components of the plasma processing apparatus 100 are controlled by a controller 140 including a microprocessor. The controller 140 include a storage unit storing process recipes serving as process sequences and control parameters of the plasma processing apparatus 100, an input means and a display and controls the plasma processing apparatus 100 according to a selected process recipe.

<Operation of Plasma Processing Apparatus>

Hereinafter, an operation of the plasma processing apparatus 100 configured as above will be described.

First, a wafer W is carried into the chamber 1 and mounted on the susceptor 11. Then, while a plasma generation gas, for example, an Ar gas, is introduced from the gas supply source 110 into the gas diffusion space 123 of the microwave radiation antenna 45 via the gas pipe 111 and discharged from the gas outlets 125, a microwave transmitted through the amplifier part 42 and the microwave radiation part 43 of each antenna module 41 of the microwave supply unit 40 is radiated from the microwave output unit 30 of the microwave plasma source 2 into the chamber 1 via the slots 122 and the annular dielectric members 126 of the microwave radiation antenna 45. Such process may allow forming a metal surface wave on a surface of the microwave radiation antenna 45 and generating a surface wave plasma. Similarly to the plasma generation gas, a processing gas is also supplied from the gas supply source 110 into the microwave radiation antenna 45 via the gas pipe 111. The processing gas is discharged from the gas outlets 125 into the chamber 1 via the gas diffusion space 123 in the antenna body 121. Then, the processing gas is excited by the surface wave plasma and converted into a plasma and the wafer W is subjected to a plasma processing, for example, etching, by the plasma of the processing gas.

When the surface wave plasma is generated, in the microwave output unit 30, the microwave power oscillated by the microwave oscillator 32 is amplified by the amplifier 33, distributed into plural ones by the distributor 34 and then guided to the microwave supply unit 40. In the microwave supply unit 40, the microwave distributed into plural ones is individually amplified in the main amplifier 48 forming a solid state amplifier, fed into the microwave transmission line 44 of the microwave radiation part 43, transmitted through the microwave transmission line 44, passing through the retardation member 82, and radiated into the chamber 1 via the slots 122 and the annular dielectric members 126 of the microwave radiation antenna 45. Then, a metal surface wave is generated in a sheath formed on the surface of the microwave radiation antenna 45 and a surface wave plasma is generated in a space within the chamber 1 by this surface wave.

In this embodiment, since both of the microwave and the gases are introduced from the microwave radiation antenna 45 forming the ceiling wall of the chamber 1 into the chamber 1, it is possible to provide good controllability of gas flow. In addition, since the microwave radiation direction overlaps with the gas flow direction, it is possible to convert the gases into plasma with efficiency.

The slots 122 through which the microwave passes are separated from the gas diffusion space 123 by the projections 127 and the gas outlets 125 are separated from the slot 122s. Further, the microwave does not transmit through the microwave radiation antenna 45 made of conductive material (metal). Accordingly, the gases are not converted into plasma when the gas passes through the gas diffusion space 123 and the gas outlets 125, and thus power loss and abnormal discharging which may be caused when the gases are converted into plasma can be inherently prevented. In addition to the problem of abnormal discharging, the prior art has a problem of difficulty in forming a shower structure in a dielectric member (microwave transmission window) provided in the leading end of the microwave radiation antenna. However, the gas outlets 125 can be formed easily in the microwave radiation antenna 45 made of metal as in the present embodiment.

In addition, since the annular dielectric member 126 is provided in the microwave radiation surface side of the antenna body 121 to include (cover) the slot formation region of each microwave radiation part 43, the microwave can be uniformly supplied and the plasma processing can be performed more uniformly. That is, when the microwave is directly radiated from the slots 122, the electric field of the microwave is strengthened at a portion corresponding to the slots 122 and the microwave is not uniformly supplied. However, when the annular dielectric member 126 is provided, since the microwave passed through the slots 122 is radiated into the chamber 1 through the annular dielectric member 126, the electric field of the microwave becomes even in the in-plane direction and the microwave can be supplied more uniformly. With this configuration, the surface wave plasma can be generated evenly and the plasma processing can be performed uniformly.

In addition, since the gas outlets 125 are formed in both of the outer and inner regions of the annular dielectric member 126 in the microwave radiation surface, the gas outlets 125 are formed in the entire microwave radiation surface other than a region where the annular dielectric member 126 is formed, thereby allowing the processing gas to be uniformly supplied into the chamber 1. With this configuration together with supplying the microwave uniformly as described above, the surface wave plasma can be generated more uniformly.

Figure 9A:
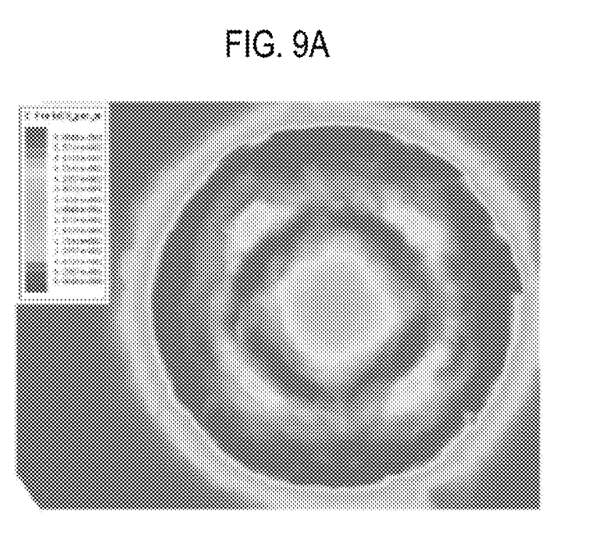
FIGS. 9A and 9B are views showing microwave electric field distributions in a case where slots are formed up to the microwave radiation surface of an antenna body without providing an annular dielectric member and in a case where an annular dielectric member is provided, respectively.
Figure 9B:
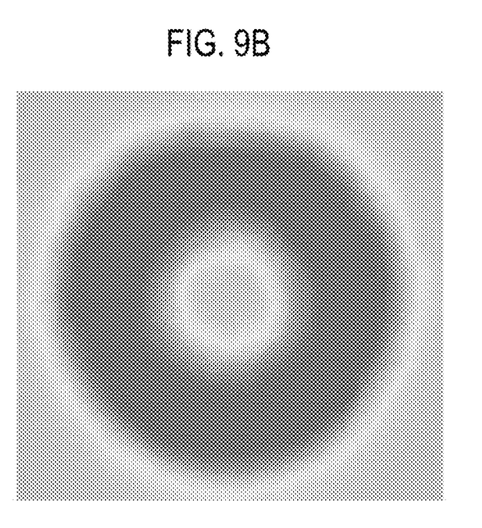

FIGS. 9A and 9B are views showing microwave electric field distributions in a case where the slots 122 are formed up to the microwave radiation surface of the antenna body 121 without providing the annular dielectric member 126 and in a case where the annular dielectric member 126 is provided, respectively. It can be seen from these figures that the microwave electric field distribution becomes uniform by providing the annular dielectric member 126.

In the case where the annular dielectric member 126 is not provided, the interior of the slots 122 is under the same vacuum atmosphere as that of the chamber 1 and electrons in plasma enter into the slots 122, which may cause abnormal discharging. However, in this embodiment, abnormal discharging does not occur because the seal member 128b serving as a vacuum seal is provided in a portion of the lower wall 121b in contact with the annular dielectric member 126 inserted into the concave portion 128 and the annular dielectric member 126 seals the slots 122. That is, since the annular dielectric member 126 vacuum-seals the slots 122 by the seal member 128b, the interior of the slots 122 is isolated from the chamber 1 under the vacuum atmosphere and is laid under the atmospheric atmosphere. Accordingly, electrons in plasma cannot enter into the slots 122, thereby reliably preventing abnormal discharging in the slots 122.

<Other Applications>

The present disclosure is not limited to the above embodiment but may be modified in different ways without departing from the spirit and scope of the present disclosure. For example, the configuration of the microwave output unit 30 and the microwave supply unit 40 is not limited to the above embodiment. For example, the phase shifter 46 is not necessary if there is no need to control the directionality of a microwave radiated from an antenna or render the microwave into circular polarization. In addition, the retardation member 82 is not essential for the microwave radiation part 43.

In addition, although the plurality of microwave radiations parts 43 is provided in the above embodiment, the number of microwave radiation parts 43 may be one.

In addition, although the plasma processing apparatus 100 is an etching processing apparatus in the above embodiment, the present disclosure is not limited thereto but may be applied to different plasma processing such as a film forming processing, an oxynitride film forming processing including nitridation and oxidation, an ashing processing and the like. Further, the substrate to be processed is not limited to the semiconductor wafer W but may be other substrates such as an FPD (Flat Panel Display) substrate that represents an LCD (Liquid Crystal Display) substrate, a ceramic substrate and the like.

According to the present disclosure, in some embodiments, an antenna body of a microwave radiation antenna is made of conductive material, slots for radiating a microwave are provided to be separated from a gas diffusion space and gas outlets, and an annular dielectric member is provided in a microwave radiation surface side of the antenna body to include a slot formation region where slots are formed. Accordingly, plasma can be uniformly generated while preventing microwave power loss and abnormal discharging.

While certain embodiments have been described, these embodiments have been presented by way of example only, and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A microwave radiation antenna that radiates a microwave generated in a microwave generation mechanism and transmitted through a microwave transmission line into a chamber in a plasma processing apparatus, the plasma processing apparatus forming a surface wave plasma in the chamber to perform plasma processing, the antenna comprising:

an antenna body having an upper wall and a lower wall, and made of conductive material, wherein the lower wall includes projections projecting upwards from the lower wall, an annular concave portion, and a microwave radiation surface;
a processing gas inlet configured to introduce a processing gas into the antenna body;
a gas diffusion space configured to diffuse the processing gas in the antenna body;
a plurality of gas outlets provided in the antenna body, and configured to discharge the processing gas diffused in the gas diffusion space into the chamber;
a plurality of slots provided, corresponding to the microwave transmission line, inside the projections of the antenna body under a state where the slots are separated from the gas diffusion space and the gas outlets, each of the slots being configured to radiate the microwave from an end portion disposed at the microwave radiation surface side; and
an annular dielectric member provided in the microwave radiation surface side of the antenna body to cover a slot formation region where the slots are formed,
wherein a metal surface wave is formed in the microwave radiation surface by the microwave radiated through the slots and the annular dielectric member and a surface wave plasma is generated by the metal surface waved, and
wherein the annular dielectric member is inserted into the annular concave portion formed in the microwave radiation surface of the antenna body.

2. The microwave radiation antenna of claim 1, wherein the plurality of gas outlets is formed in both of outer and inner regions of the annular dielectric member in the microwave radiation surface of the antenna body.

3. The microwave radiation antenna of claim 1, wherein a seal is provided between the annular dielectric member and the slots of the antenna body.

4. The microwave radiation antenna of claim 3, wherein the seal between the annular dielectric member and the slots of the antenna body is a vacuum seal and a vacuum atmosphere region in the chamber and an atmospheric atmosphere region including the slots are partitioned by the vacuum seal.

5. A microwave plasma source that generates a surface wave plasma by radiating a microwave into a chamber of a plasma processing apparatus, comprising:
a microwave output unit configured to generate and output the microwave; and
a microwave supply unit configured to transmit the microwave output from the microwave output unit and radiate the microwave into the chamber,
wherein the microwave supply unit includes the microwave radiation antenna of claim 1.

6. The microwave plasma source of claim 5, wherein the microwave supply unit includes a plurality of microwave radiation parts connected to the microwave radiation antenna, each of the microwave radiation parts having a microwave transmission line, and the microwave radiation antenna includes a plurality of slots for each of the plurality of microwave radiation parts.

7. A plasma processing apparatus comprising:
a chamber configured to accommodate a substrate to be processed;
a gas supplying mechanism configured to supply a processing gas; and
the microwave plasma source of claim 5,
wherein a metal surface wave is formed on a surface of the microwave radiation antenna by the microwave supplied from the microwave radiation antenna of the microwave plasma source into the chamber,
wherein a surface wave plasma of a gas supplied from the gas supplying mechanism is generated by the metal surface wave, and
wherein the substrate in the chamber is processed by the plasma.

* * * * *

UNITED STATES PATENT AND TRADEMARK OFFICE
CERTIFICATE OF CORRECTION

PATENT NO.        : 9,548,187 B2
APPLICATION NO.   : 14/095563
DATED             : January 17, 2017
INVENTOR(S)       : Taro Ikeda et al.

It is certified that error appears in the above-identified patent and that said Letters Patent is hereby corrected as shown below:

In the Claims

Claim 1, Column 15, Line 25, please replace "by the metal surface waved" with "by the metal surface wave".

Signed and Sealed this
Fourteenth Day of March, 2017

Michelle K. Lee
*Director of the United States Patent and Trademark Office*